United States Patent [19]
Reeser et al.

[11] Patent Number: 5,856,763
[45] Date of Patent: Jan. 5, 1999

[54] DUAL FREQUENCY VOLTAGE CONTROLLED OSCILLATOR

[75] Inventors: Glen O. Reeser, Palatine; Lunal Khuon, Bolingbrook, both of Ill.

[73] Assignee: Motorola Inc., Schaumburg, Ill.

[21] Appl. No.: 811,997

[22] Filed: Mar. 5, 1997

[51] Int. Cl.[6] ................................................. H03B 5/20
[52] U.S. Cl. ...................... 331/49; 331/36 C; 331/117 R; 331/117 V
[58] Field of Search .................................. 331/49, 117 R, 331/117 V, 36 C

[56] References Cited

U.S. PATENT DOCUMENTS

| | | | |
|---|---|---|---|
| 3,579,115 | 5/1971 | Goncharoff | 325/438 |
| 3,579,281 | 5/1971 | Kam | 332/30 V |
| 4,621,241 | 11/1986 | Kiser | 331/117 R |
| 5,107,228 | 4/1992 | Pham et al. | 331/117 R |
| 5,245,298 | 9/1993 | Pham | 311/117 R |
| 5,418,497 | 5/1995 | Martin | 331/48 |
| 5,418,500 | 5/1995 | Igarashi | 311/76 |
| 5,497,128 | 3/1996 | Sasaki | 331/38 |
| 5,534,825 | 7/1996 | Goma et al. | 331/117 R |
| 5,535,432 | 7/1996 | Dent | 455/77 |
| 5,576,667 | 11/1996 | Goma | 331/117 D |
| 5,600,297 | 2/1997 | Mori | 331/36 |

*Primary Examiner*—David Nelms
*Assistant Examiner*—Tuan T. Nguyen
*Attorney, Agent, or Firm*—Brian M. Mancini; Gary J. Cunningham

[57] ABSTRACT

A voltage controlled oscillator (10) operable on two widely separated frequency bands of 800 MHz and 1.9 GHz, for example. The two operable frequency modes are controlled by changing base bias voltages on at least two transistors with commonly connected emitters. A base circuit of each transistor is connected to an independent resonator and tuning element and shares a common feedback reactance. By increasing a base bias voltage of first transistor relative the a second transistor, an associated first base circuit is turned on and allowed to oscillate at a first frequency while a second base circuit is turned off preventing oscillation at a second frequency. Correspondingly, by decreasing the base bias voltage the first base circuit is turned off and the second base circuit is turned on. The transistors share a common collector connection and output providing either one of the two frequencies.

19 Claims, 7 Drawing Sheets

DUAL FREQUENCY VOLTAGE CONTROLLED OSCILLATOR

FIELD OF THE INVENTION

The present invention relates generally to voltage controlled oscillators used in frequency synthesizers in communication devices and, in particular, to a dual frequency voltage controlled oscillator.

BACKGROUND OF THE INVENTION

New frequency spectrum allocations for personal communications have created a need for portable telephones which operate both in the existing 800 MHz frequency band as well as the newly allocated 1.9 GHz frequency band. Therefore, local oscillators for these dual band portable telephones are required to operate in two widely separated frequency ranges.

Prior art dual band devices have included; completely separate local oscillators with combiner networks, local oscillators with doublers or triplers to multiply the frequency, pin diodes or other similar RF switching devices, and extremely wide band oscillators having an operable frequency range that overlaps the two bands of interest.

The disadvantage of using completely separate local oscillators with combiner networks is that two complete sets of VCO circuitry are required in addition to the combiner network circuitry which adds cost and size to the overall circuit. Further, typical combiner networks waste power.

The disadvantage of using local oscillators with doublers or triplers to multiply the frequency is that spurious signals are always present in the output. These spurious signals must be filtered out to avoid degrading receiver performance or interference with other radio services. In addition, running multiple frequency sources wastes power.

The disadvantage of pin diodes is that pin diodes require significant DC current to obtain a low "on" impedance, and when the pin diodes are "off" they can create high levels of harmonically related spurious signals. Moreover, tank circuits associated with the pin diodes reduce circuit Q, which reduces efficiency, and causes higher phase noise in the output circuit.

The disadvantage of using extremely wide band oscillators is that wideband oscillators are necessarily very sensitive to tuning control. This sensitivity makes the oscillator more susceptible to noise on the tuning control line. Correspondingly, more sensitive tuning requires tighter coupling to the tuning (voltage variable reactance) element of the oscillator which causes higher losses in the associated tank circuit.

There is a need for a voltage controlled oscillator that: can generate different frequencies, operates on only one frequency at a time to save power, does not require completely separate oscillator circuits to obtain different frequencies, does not require combiners or pin diodes, has narrow band operation within either of two widely spaced frequency bands, is not sensitive to noise on a tuning control, exhibits a good frequency stability, minimizes spurious frequency signals, has low losses and current drain, and requires simpler, and therefore less costly, circuitry.

DETAILED DESCRIPTION OF THE PREFERRED EMBODIMENT

The present invention is a multi-frequency oscillator with two or more frequency modes of operation. A selected band of frequency operation is selected by changing a base bias voltage on one or more of a plurality of transistors used as gain blocks in oscillator loops. The transistors are commonly DC coupled at their emitters. A base circuit of each transistor is coupled to a resonator. Preferably, a tuning element, such as a voltage variable reactive element, is coupled with the resonator to provide frequency tuning. More preferably, the voltage variable reactive element is a voltage variable capacitor or varactor.

By increasing a base bias voltage of a first transistor over the base bias voltages of the other transistors, the first transistor is caused to conduct, or turn on. This, in turn, causes an emitter current to flow in the first transistor reducing the relative base bias voltages of the other transistors relative to their commonly connected emitters causing them to stop conducting, or turn off. The active transistor allows the resonator of the associated base circuit to resonate at its particular predetermined frequency while the resonators of the remaining base circuits are inactive.

Figure 1:
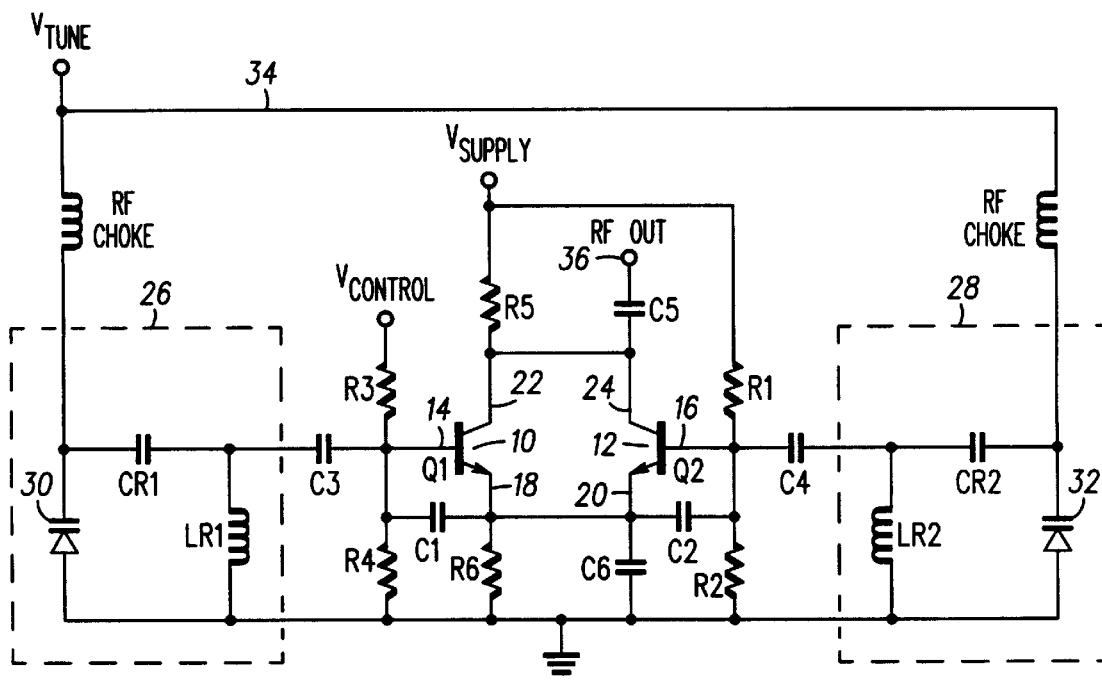
FIG. 1 is a schematic diagram of a first embodiment of a single output, dual frequency voltage controlled oscillator, in accordance with the present invention.

Referring to FIG. 1, a first embodiment of the multi-frequency oscillator includes a first and a second transistor 10, 12 each having respective bases 14, 16, emitters 18, 20, and collectors 22, 24. In this embodiment, the emitters 18, 20 of the transistors 10, 12 are commonly AC and DC coupled. The first and second bases 14, 16 are coupled with respective first and second resonators 26, 28 which are designed to resonate at a predetermined frequency. Each resonator 26, 28 is operable at a different frequency band.

For the circuit shown in FIG. 1, for example, the first resonator 26 is designed to resonate at about 800 MHz, and the second resonator 28 is designed to resonate at about 1.9 GHz. In a preferred embodiment, the resonator is a stripline. Designing resonators is known in the art and will not be presented here.

In a preferred embodiment, the multi-frequency oscillator is a dual band voltage controlled oscillator with each resonant circuit 26, 28 being coupled with a respective variable reactance element 30, 32, such as a voltage variable capacitor or varactor, each of which is responsive to a tuning signal 34 via an RF choke, as shown in FIG. 1. The tuning signal 34 tunes the resonant circuit within its operable predetermined frequency band. This is particularly useful in radio communication devices using frequency synthesizers that change channels within a frequency band during operation. More preferably, all the variable reactance elements 30, 32 are responsive to one tuning signal 34. This is allowable by having only one resonant circuit being operable at any one time. Therefore, the tuning signal 34 can be commonly shared by all the resonant circuits since only one resonant circuit will be active. For example, when the first resonant circuit 26 is operating at a 800 MHz frequency band the second resonant circuit 28 is inactive. Therefore, the first varactor 30 is responsive to the tuning signal 34 so as to change channel frequencies within the 800 MHz band, while the second resonant circuit 28 is inactive and does not respond to the tuning signal 34.

In particular, the configuration of FIG. 1 includes two transistors Q1 and Q2 with commonly connected emitters and collectors. A base of transistor Q2 is AC coupled to a second resonator 28 through a DC blocking capacitor C4 having a value of about 3.6 pF. The resonator contains an LC circuit, shorted tuned stub, or shorted stripline preferably, which resonates at about 1.9 GHz, for example. The resonator is shown as an equivalent LC network, $L_{R2}$ and $C_{R2}$. The actual component values can vary as long as the LC network resonates at the desired frequency band, 1.9 GHz for example. The resonator 28 also includes a voltage variable reactance element such as a varactor 32 which, during operation of the oscillator, is used to tune the resonator to particular frequency channels within the operable frequency band. The varactor 32 is tunable within a range of from about 8 pf to about 20 pf and is tuned by a tuning signal, $V_{tune}$, coupled to the varactor via an RF choke. The base of transistor Q2 is constantly biased by $V_{supply}$ through a resistor network, R1 and R2. Preferably, R1 is about 2 kohms and R2 is about 3 kohms, although the exact values are not critical. A feedback capacitor, C2, having a value of about 2 pf is connected across the base and emitter of Q2. Another feedback capacitor, C6, having a value of about 1 pf is connected from the common emitter connection to ground. Resistors R5 and R6 are used as all-frequency chokes to the supply. R5 has a value of about 50 ohms and is connected between supply and the common collector connection. R6 has a value of about 100 ohms and is connected between the common emitter connection and ground.

A base of transistor Q1 is AC coupled to a first resonator 26 through a DC blocking capacitor C3 having a value of about 6.8 pF. The resonator contains an LC circuit, shorted tuned stub, or shorted stripline preferably, which resonates at about 800 MHz, for example. The resonator 26 is shown as an equivalent LC network, $L_{R1}$ and $C_{R1}$. The actual component values can vary as long as the LC network resonates at the desired frequency band, 800 MHz for example. The resonator 26 also contains a varactor 30 which is used to tune the resonator to particular channels within the operable frequency band. The varactor 30 is tuned by a tuning signal, $V_{tune}$, coupled to the varactor via an RF choke. $V_{tune}$ is commonly connected to both varactors 30, 32. A feedback capacitor, C1, having a value of about 5 pf is connected across the base and emitter of Q1. The base of transistor Q1 is biased by $V_{control}$ through a resistor network, R3 and R4. Preferably, R3 is 1 kohms and R4 is 4 kohms, although the exact values are not critical. However, it is critical that the ratio of R4/R3 be greater than the ratio of R2/R1 to ensure that Q1 will be biased at a higher voltage than Q2. This controls Q1 to be off when Q2 is on and Q1 to be on when Q2 is off. The collectors 22, 24 of Q1 and Q2 are commonly AC and DC coupled and provide a single RF output 36 via a DC blocking capacitor, C5, of 1 pf value.

The operating frequency band of the voltage controlled oscillator is determined by the relative base bias voltages of the transistors. The second base 16 is biased at a predetermined bias voltage greater than a base-emitter junction voltage of the transistors 10, 12. When the first base 14 is biased (by $V_{control}$) at a voltage greater than the predetermined bias voltage of the second base 16, the first transistor 10 turns on which causes the first resonant circuit 26 to operate at a first frequency and which drives the emitter 20 of the second transistor 12 such that a potential across the second base 16 and emitter 20 is less than the base-emitter junction voltage of the transistors. This turns the second transistor 12 and second resonant circuit 28 off.

When the first base 14 is biased (by $V_{control}$) at a voltage less than the base-emitter junction voltage of the transistors 10, 12, the first transistor 10 and first resonant circuit 26 turn off. The second transistor 12, being biased at the predetermined bias voltage, turns on which causes the second resonant circuit 28 to operate at a second frequency, such as 1.9 GHz for example.

In the first embodiment of the present invention, as shown in FIG. 1, the collectors 22, 24 of the transistors 10, 12 are commonly electrically connected such that a single VCO RF output 36 is provided which is operable within one or the other of the first and second frequency bands. Also shown is an additional varactor tuning arrangement wherein varactor elements (shown as 30, 32) are coupled with respective resonant circuits and are tuned with a single tuning signal ($V_{tune}$) input. In addition, the oscillator shown is a Colpitts configuration. However, this is not a requirement of the invention, and the oscillator may be of other oscillator configurations including, but not limited to, Clapp, Driscoll, Butler, Pierce, and Hartley.

The novel configuration of the transistors and VCO advantageously: can generate widely different (greater than 20 percent) frequencies without using a wideband oscillator design, operates on only one frequency at a time to save power, does not require completely separate oscillator circuits to obtain different frequencies, does not require combiners or pin diodes, has narrow band operation within either of two widely spaced frequency bands, is less sensitive to noise on a tuning control, exhibits a good frequency stability, has minimized spurious frequency generation, has low losses and current drain, and uses simpler, and therefore less costly, circuitry.

Figure 2:
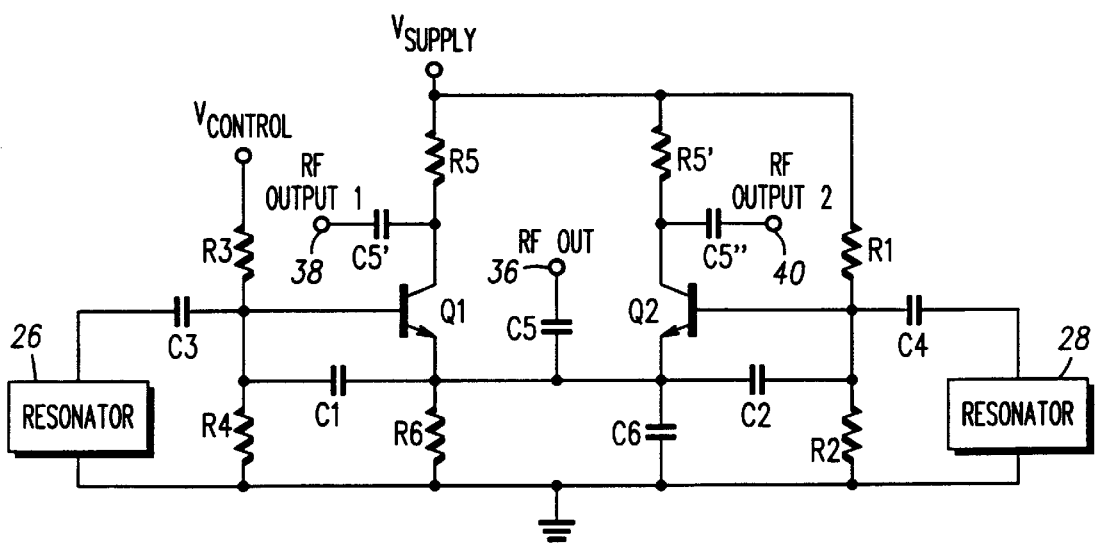
FIG. 2 is a schematic diagram of a second embodiment of a dual output, dual frequency voltage controlled oscillator, in accordance with the present invention.

In a second embodiment of the present invention, referring to FIG. 2, the voltage controlled oscillator is substantially the same as the first embodiment, but includes the collector 22, 24 of each transistor 10, 12 providing separate respective VCO RF output signals, RF output 1 (38) and RF output 2 (40) via identical AC coupling capacitors C5' and C5". Only one of the output signals 38, 40 will be active at a frequency of the associated resonant circuit 26, 28 when the particular resonant circuit is operating. Remaining RF outputs 40, 38 will have no output signal since their associated resonant circuits are inactive.

In a preferred embodiment, the oscillator is of a Colpitts configuration. However, this is not a requirement of the invention, and the oscillator design can be of other configurations including Clapp, Driscoll, Butler, Pierce, and Hartley designs. In addition, a third RF output, which is substantially the same signal as RF out 36 of FIG. 1, is taken from the common emitter connection of the transistors via AC coupling capacitor C5. RF out 36 generates a signal in both operating frequency bands and is used to provide a feedback signal for a locked loop circuit. AC coupling capacitors C5, C5' and C5" have equivalent values.

In operation, a high $V_{control}$ signal will turn Q1 on and Q2 off, which causes a first frequency to be generated at RF out (36) and RF output 1 (38). A low $V_{control}$ signal will turn Q1 off and Q2 on, which causes a second frequency to be generated at RF out (36) and RF output 2 (40). RF out 36 is used as the feedback signal. It should be recognized that the resonators 26, 28 can incorporate tuning varactors in this embodiment as was presented for the first embodiment.

Figure 3:
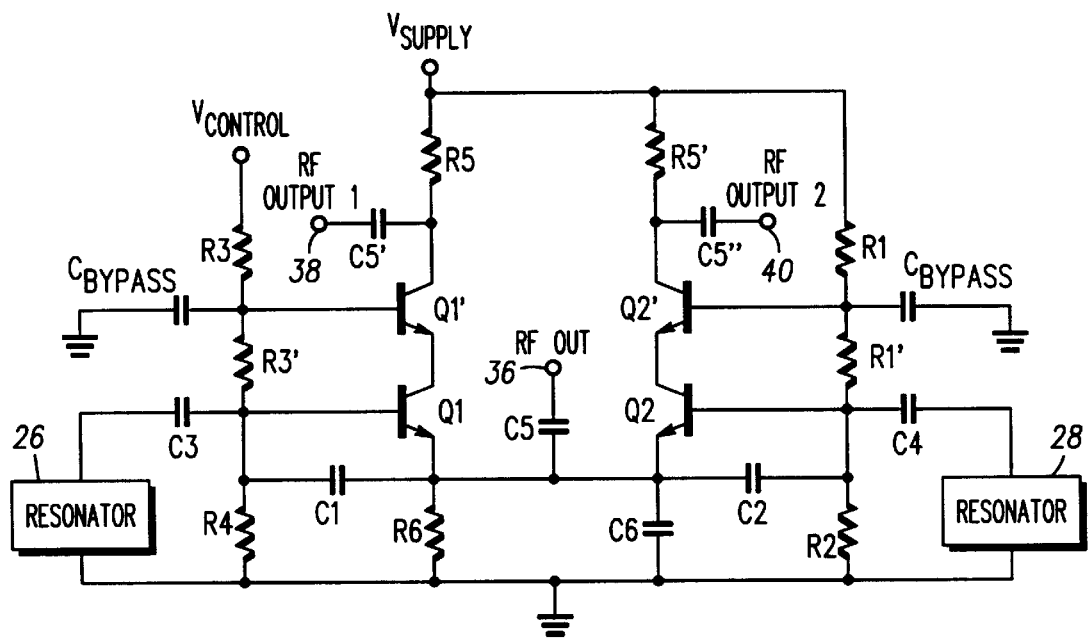
FIG. 3 is a schematic diagram of a third embodiment of a dual output, dual frequency voltage controlled oscillator, in accordance with the present invention.

FIG. 3 shows a third embodiment of the present invention being a cascode dual switched Colpitts oscillator with two switched buffered outputs (RF output 1 and RF output 2) and one output (RF out). The reference numbers and labels used for FIG. 3 are commensurate with the numbers and labels of FIG. 2 which are hereby incorporated by reference. In the third embodiment RF out 36 is continuously on and is used as a feedback signal for a locked loop signal, such as a phase locked loop, a frequency locked loop, or a delay locked loop. In addition, Q1 and Q2 are equivalent to Q1' and Q2' respectively, R3 is equivalent to R3' and R1 is equivalent to R1'. The circuit of FIG. 3 works substantially the same as that of FIG. 2. The difference of note is that bypass capacitors C bypass (typically 50 pf to 100 pf) coupled the bases of Q1' and Q2' to ground. Also, transistors Q2 and Q2' are biased at a predetermined point and the associated transistor pairs Q1 and Q1' are biased such that when $V_{control}$ is high, Q1 and Q1' are on and Q2 and Q2' are off. When $V_{control}$ is low, Q1 and Q1' are off and Q2 and Q2' are on. The use of the buffering transistors Q1' and Q2' advantageously reduces loading of the oscillator.

Figure 4:
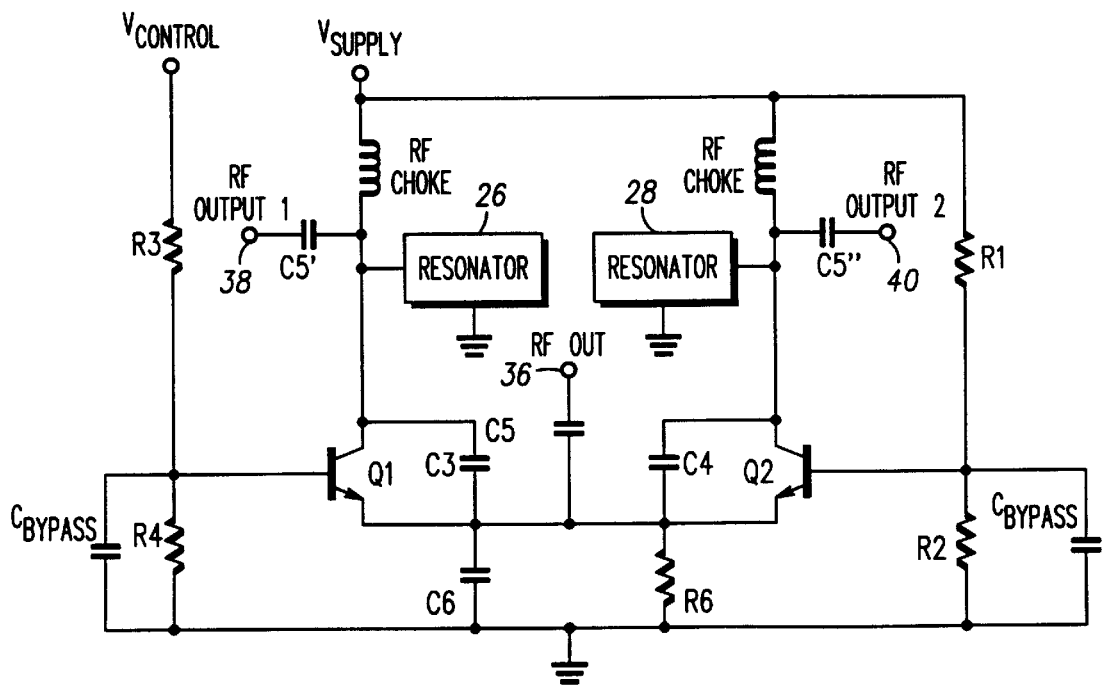
FIG. 4 is a schematic diagram of a fourth embodiment of a dual output, dual frequency voltage controlled oscillator, in accordance with the present invention.

FIG. 4 shows a fourth embodiment of the present invention being a common base Colpitts (Seiler) oscillator design. The reference numbers and labels used for FIG. 4 are commensurate with the numbers and labels of FIG. 3 which are hereby incorporated by reference. In this embodiment the resonators 26, 28 are coupled in a respective collector circuit of each transistor Q1 and Q2. The operation of this embodiment is essentially the same as that of FIG. 3 with the addition of appropriate RF chokes and bypass capacitors as shown. This circuit may be operated as a single output design (dual bands from RF out 36), or optionally as a dual output design (single band operating from either of RF output 1 (38) or RF output 2 (40)) with an RF feedback signal provided by RF out 36 for use as a locked loop signal, such as a phase locked loop, a frequency locked loop, or a delay locked loop.

Figure 5:
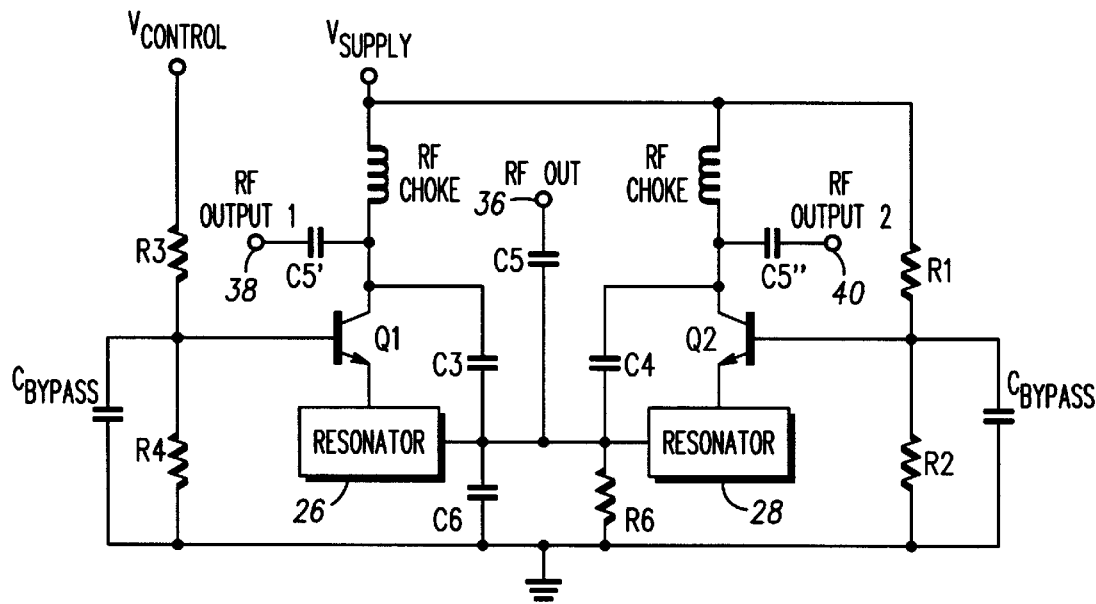
FIG. 5 is a schematic diagram of a fifth embodiment of a dual output, dual frequency voltage controlled oscillator, in accordance with the present invention.

FIG. 5 shows a fifth embodiment of the present invention being a Butler oscillator design. The reference numbers and labels used for FIG. 5 are commensurate with the numbers and labels of FIG. 4 which are hereby incorporated by reference. In this embodiment the resonators 26, 28 are coupled in a respective emitter circuit of each transistor Q1 and Q2. The operation of this embodiment is essentially the same as that of FIG. 4. This circuit may be operated as a single output design (dual bands from RF out 36), or optionally as a dual output design (single band operating from either of RF output 1 (38) or RF output 2 (40)) with an RF feedback signal provided by RF out 36 for use as a locked loop signal, such as a phase locked loop, a frequency locked loop, or a delay locked loop. This design is slightly different than the other embodiments presented in that the emitters of the transistors Q1 and Q2 are only DC coupled due to the intervening resonators circuits 26, 28. The other embodiments presented have both AC and DC coupled at the emitters of the transistors Q1 and Q2.

Figure 6:
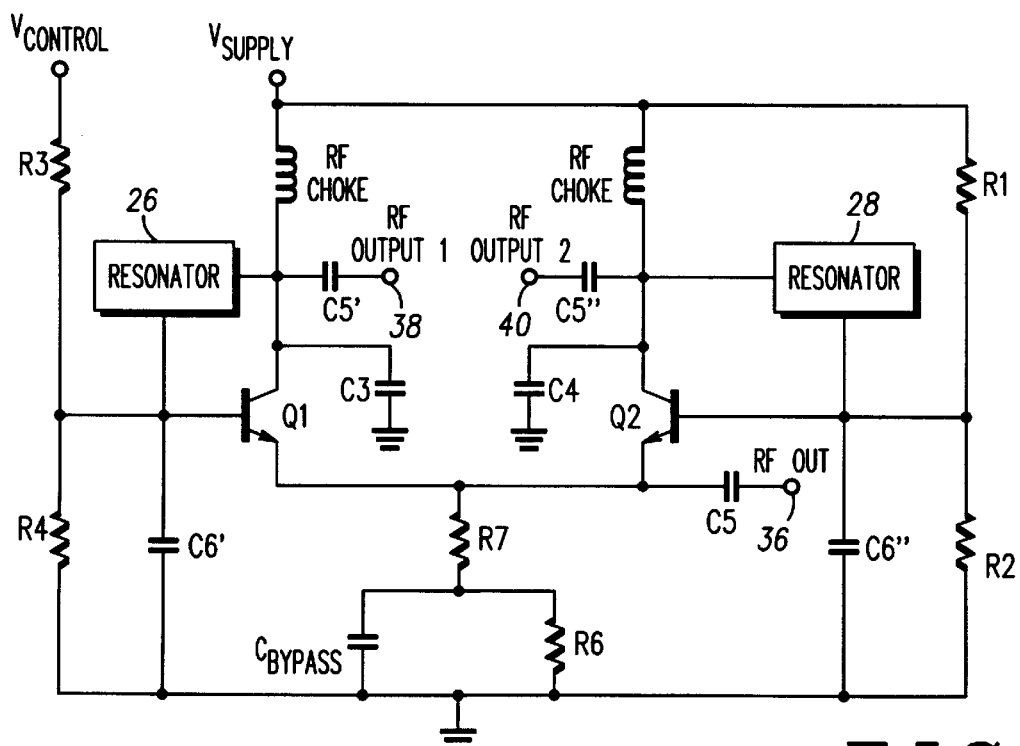
FIG. 6 is a schematic diagram of a sixth embodiment of a dual output, dual frequency voltage controlled oscillator, in accordance with the present invention.

FIG. 6 shows a sixth embodiment of the present invention being a Pierce oscillator design. The reference numbers and labels used for FIG. 6 are commensurate with the numbers and labels of FIG. 5 which are hereby incorporated by reference. In this embodiment, the resonators 26, 28 are coupled in a respective base-collector circuit of each transistor, Q1 and Q2. Feedback capacitors C6' and C6" have been added to the respective base circuit of each transistor, Q1 and Q2. A common bypass capacitor, $C_{bypass}$, is shared between the transistor circuits. The operation of this embodiment is essentially the same as that of FIG. 5. In a preferred embodiment, an additional small valued (<10 ohms) resistor, R7, is inserted at the transistor common emitter node as shown to increase output at RF out 36. This circuit may be operated as a single output design (dual bands from RF out 36), or optionally as a dual output design (single band operating from either of RF output 1 (38) or RF output 2 (40)) with an RF feedback signal provided by RF out 36 for use as a locked loop signal, such as a phase locked loop, a frequency locked loop, or a delay locked loop.

Figure 7:
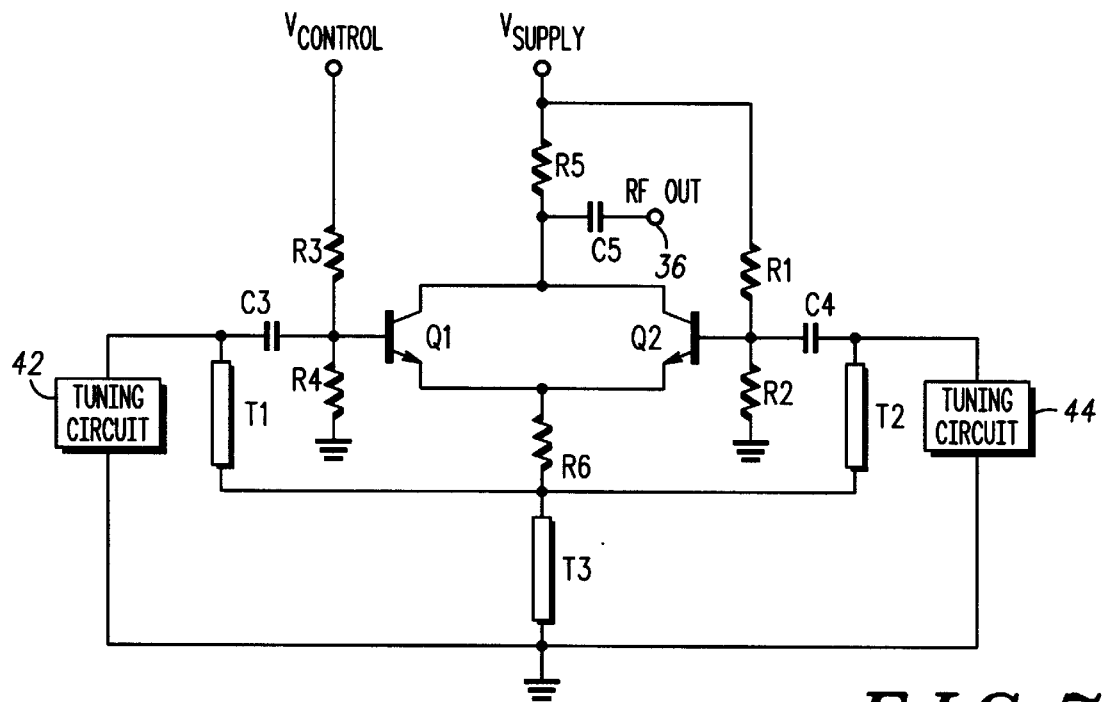
FIG. 7 is a schematic diagram of a seventh embodiment of a single output, dual frequency voltage controlled oscillator, in accordance with the present invention.

FIG. 7 shows a seventh embodiment of the present invention being a single-output Hartley oscillator design. The reference numbers and labels used for FIG. 7 are commensurate with the numbers and labels of FIG. 1 which are hereby incorporated by reference. In this embodiment, transmission line resonators T1 and T2 are coupled in respective base circuits of each transistor Q1 and Q2. A feedback transmission line T3 is provided being coupled to both resonators T1 and T2. The operation of this embodiment is essentially the same as that of FIG. 1. In a preferred embodiment, additional tuning circuits 42, 44 are coupled with respective resonators T1 and T2 to provide within band tuning. These tuning circuits 42, 44 can be similar to the varactor/RF choke circuits shown in FIG. 1 (shown as 30, 32). This circuit is operated as a single output design (dual bands from RF out 36). Alternatively, it should be recognized that the transmission lines T1, T2 and T3 can be replaced by equivalent valued inductors.

Figure 8:
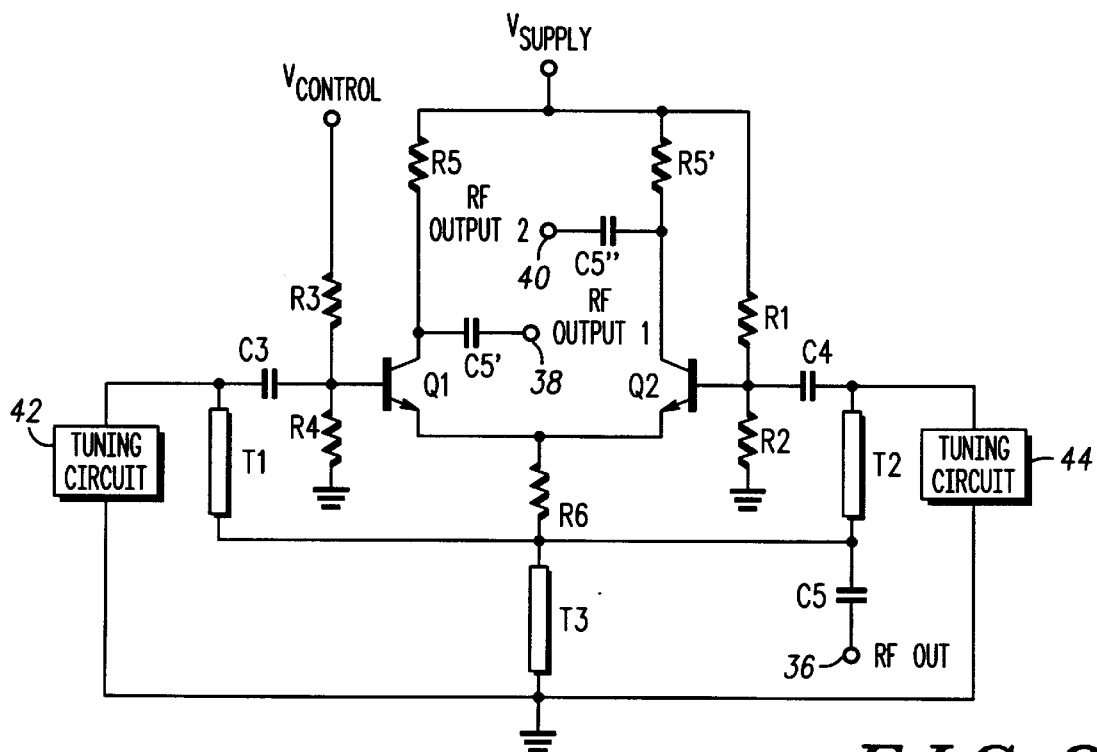
FIG. 8 is a schematic diagram of a eighth embodiment of a dual output, dual frequency voltage controlled oscillator, in accordance with the present invention.

FIG. 8 shows an eighth embodiment of the present invention being a dual-output Hartley oscillator design. The reference numbers and labels used for FIG. 8 are commensurate with the numbers and labels of FIG. 7 which are hereby incorporated by reference. This embodiment includes the collector 22, 24 of each respective transistor Q1 and Q2 providing separate respective VCO RF output signals, RF output 1 (38) and RF output 2 (40) via respective AC coupling capacitors C5' and C5". Only one of the output signals 38, 40 will be active at a frequency of the associated tuning circuit 42, 44 when the particular tuning circuit is operating. Remaining RF outputs 40, 38 will have no output signal since their associated tuning circuits are inactive. Optionally, an RF feedback signal is provided by RF out 36 for use as a locked loop signal, such as a phase locked loop, a frequency locked loop, or a delay locked loop.

Figure 9:
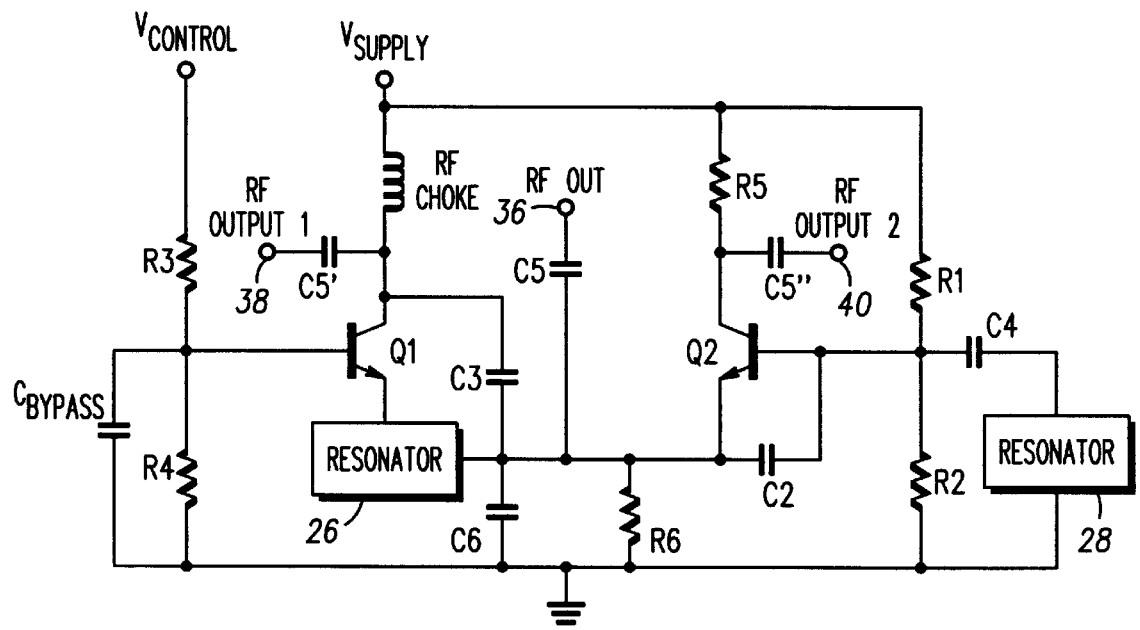
FIG. 9 is a schematic diagram of a hybrid embodiment of a dual frequency voltage controlled oscillator, in accordance with the present invention.

It should be recognized that various combinations of the above embodiments can be combined in many configurations. For example, FIG. 9 shows a hybrid combination of a common-base Butler design operational at 800 MHz and a Colpitts design operational at 1.9 GHz. The left side of the circuit is a Butler design operable as described for FIG. 5 above. The right side of the circuit is a Colpitts design operable as described for FIG. 2 above. This circuit may be operated as a single output design (dual bands from RF out 36), or optionally as a dual output design (single band operating from either of RF output 1 (38) or RF output 2 (40)) with an RF feedback signal provided by RF out 36 for use as a locked loop signal, such as a phase locked loop, a frequency locked loop, or a delay locked loop. It should be understood that all various rearrangements and combinations of the preceding embodiments are within the scope of the present invention.

All of the above embodiments of the dual mode voltage controlled oscillator have particular distinctive features. First, the emitters of the transistors share a common node for AC and DC operation (except for the Butler configuration of FIG. 5 which only has a DC common node due to the location of the resonators at the emitter). Second, a DC control voltage feeds a voltage divider resistor string used to bias the base of one of the transistors. A supply voltage is used to feed a voltage divider resistor string used to bias the base of the remaining transistors. Also, the control voltage could be interchanged with the supply voltage since either of the transistor bases could be switchably biased. Third, the collectors of the transistors are DC supplied by a supply voltage. Fourth, one, two or three RF outputs can be taken from the dual mode VCO. The outputs could be taken from the transistors' collectors which are isolated from AC ground, by an RF choke or a low impedance resistor, for an essentially common collector configuration. A single RF output containing either of the frequency bands of operation could be taken at a collector, if both transistor collectors share a common low impedance device, or from the emitter. Fifth, a feedback reactance of the oscillator loop is shared by both transistors with exception of the Pierce configuration (FIG. 6) which has a feedback tap network at the collector and base of the transistors.

Figure 10:
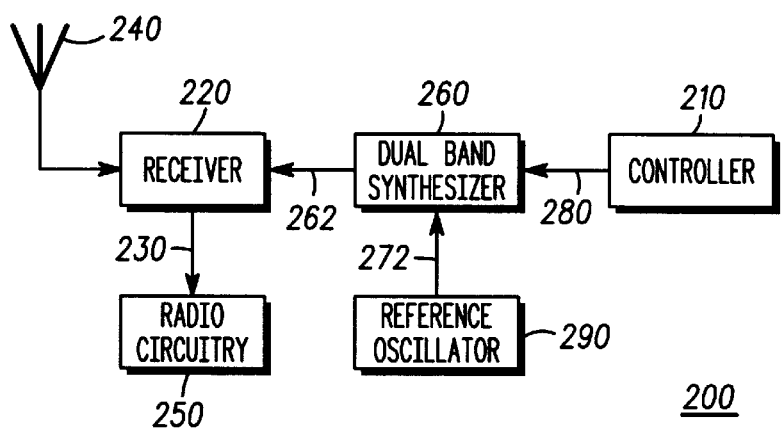
FIG. 10 is a block diagram of frequency synthesizer incorporating a dual frequency voltage controlled oscillator, in accordance with the present invention.

FIG. 10 shows a block diagram of a communication device 200 which includes a frequency synthesizer 260 which contains a dual frequency voltage controlled oscillator, in accordance with the present invention. The communication device can be a transmitter, transceiver, or a receiver. In one embodiment, the communication device 200 comprises a frequency synthesized receiver which provides an output 230 to associated radio circuitry 250. The communication device 200 includes a receiver 220 which receives RF signals via an antenna 240 of a preferably dual-mode design. The receiver 220 can be controlled by the controller 210 in either digital or analog communication applications. A reference oscillator 290 provides a reference oscillator signal 272 for the synthesizer 260. The synthesizer 260 provides a receiver local oscillator signal 262, which is controlled by the dual frequency voltage controlled oscillator of the present invention, to the receiver 220. The voltage controlled oscillator of the frequency synthesizer 260 is operable on at least two frequency bands, utilizing the principles of the present invention, controlled by a band change signal 280 from the controller 210.

In another embodiment, the communication device is a transceiver such as in a cellular phone. The synthesizer provides an additional transmitter local oscillator signal controlled by the dual frequency voltage controlled oscillator. The voltage controlled oscillator of the frequency synthesizer is operable on two frequency bands, as described above. The transmitter and receiver are switchably connected to the antenna under control of the controller.

Figure 11:
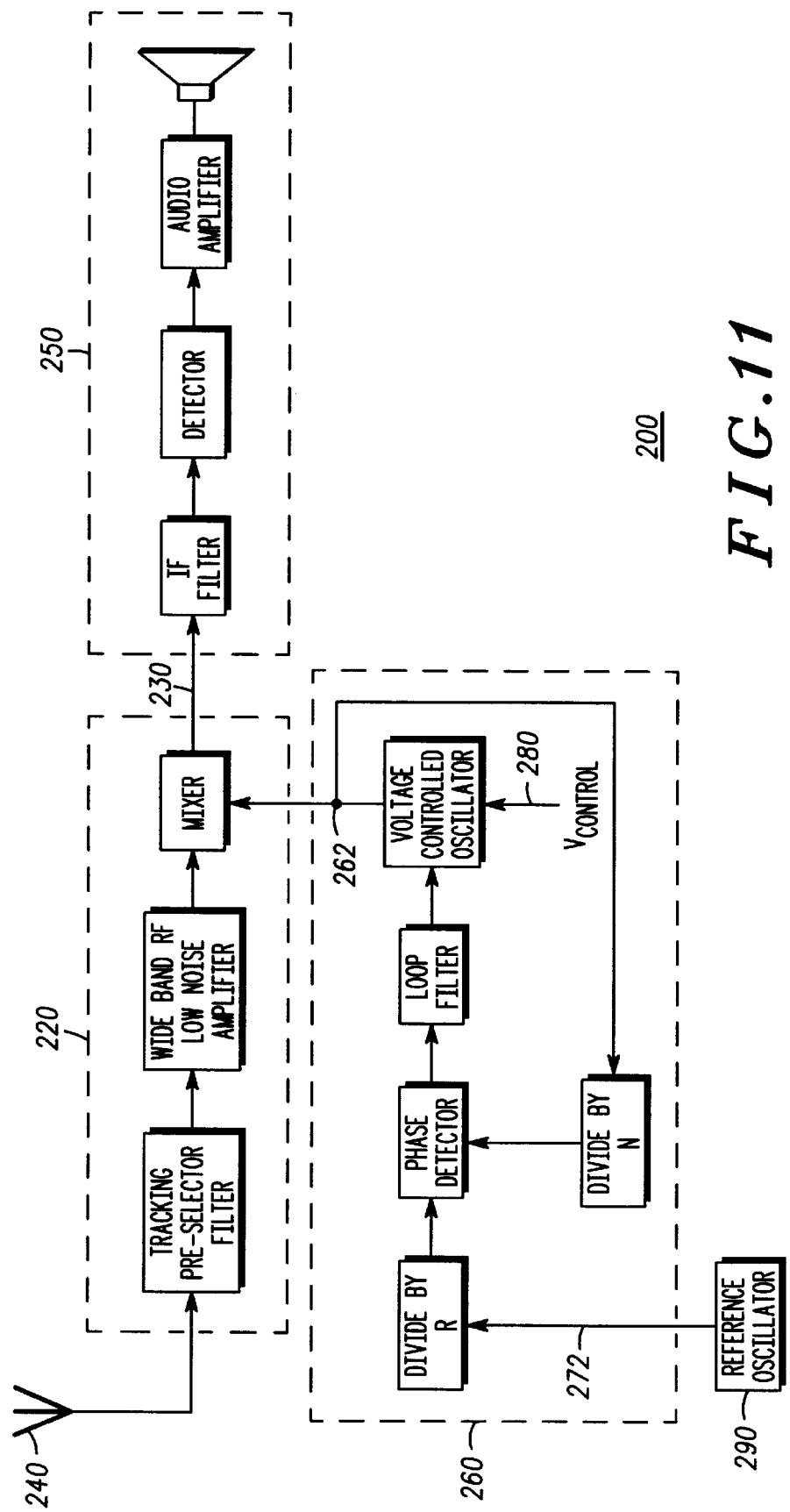
FIG. 11 is a block diagram of a radio communication device incorporating a single output, dual frequency voltage controlled oscillator, in accordance with the present invention.

FIG. 11 shows a first preferred embodiment of a radio receiver 200 of FIG. 10 utilizing the single output, dual band voltage controlled oscillators of FIGS. 1, 4–7 and 9. The radio receiver includes an antenna 240 coupled to a receiver 220 which provides an output 230 to associated radio circuitry 250, a reference oscillator 290 coupled to a dual band frequency synthesizer 260 controlled by a band change signal 280 and incorporating the VCO of the present invention and feeding a local oscillator signal 262 to the receiver 220.

The radio receiver 220 includes a tracking pre-selector filter which selectively passes desired frequency bands; 800 MHz and 1.9 GHz, for example. The tracking pre-selector filter feeds a filtered signal to a wideband RF amplifier. Preferably, the amplifier is of a low noise design that can amplify 800 MHz and 1.9 GHz signals for example. The amplifier provides an amplified signal to a mixer. The frequency synthesizer 260 provides one of two frequency band signals to the mixer. The frequency band provided is responsive to a band change signal 280. For example, when $V_{control}$ is held low, a local oscillator signal 262 within a 1.9 GHz band is produced, and when $V_{control}$ is held high, a local oscillator signal 262 within a 800 MHz band is produced. The mixer provides a mixed down IF output 230 to associated radio circuitry 250.

The associated radio circuitry 250 can contain an IF filter, detector, audio amplifier, and transducer, for example. The IF filter selects the correct IF output from the multiple frequency products produced by the mixer. The correct IF output is converter to an audio signal in the detector, which is subsequently amplified and transduced by a speaker into an audio signal, for example.

The frequency synthesizer 260 includes the VCO of the present invention which provides a feedback signal from the local oscillator signal 262 to a phase detector via a first divider. The reference oscillator 290 also provides a reference signal 272 to the phase detector via a second divider. The phase detector provides a correction signal to the VCO via a low pass loop filter, which removes high frequency artifacts. The correction signal is proportional to the phase difference between inputs to the phase detector which is known in the art as a phase locked loop. The present invention advantageously uses a dual band VCO, without changing any other components of the phase locked loop, to provide two widely (greater than 20 percent) dissimilar frequencies.

Figure 12:
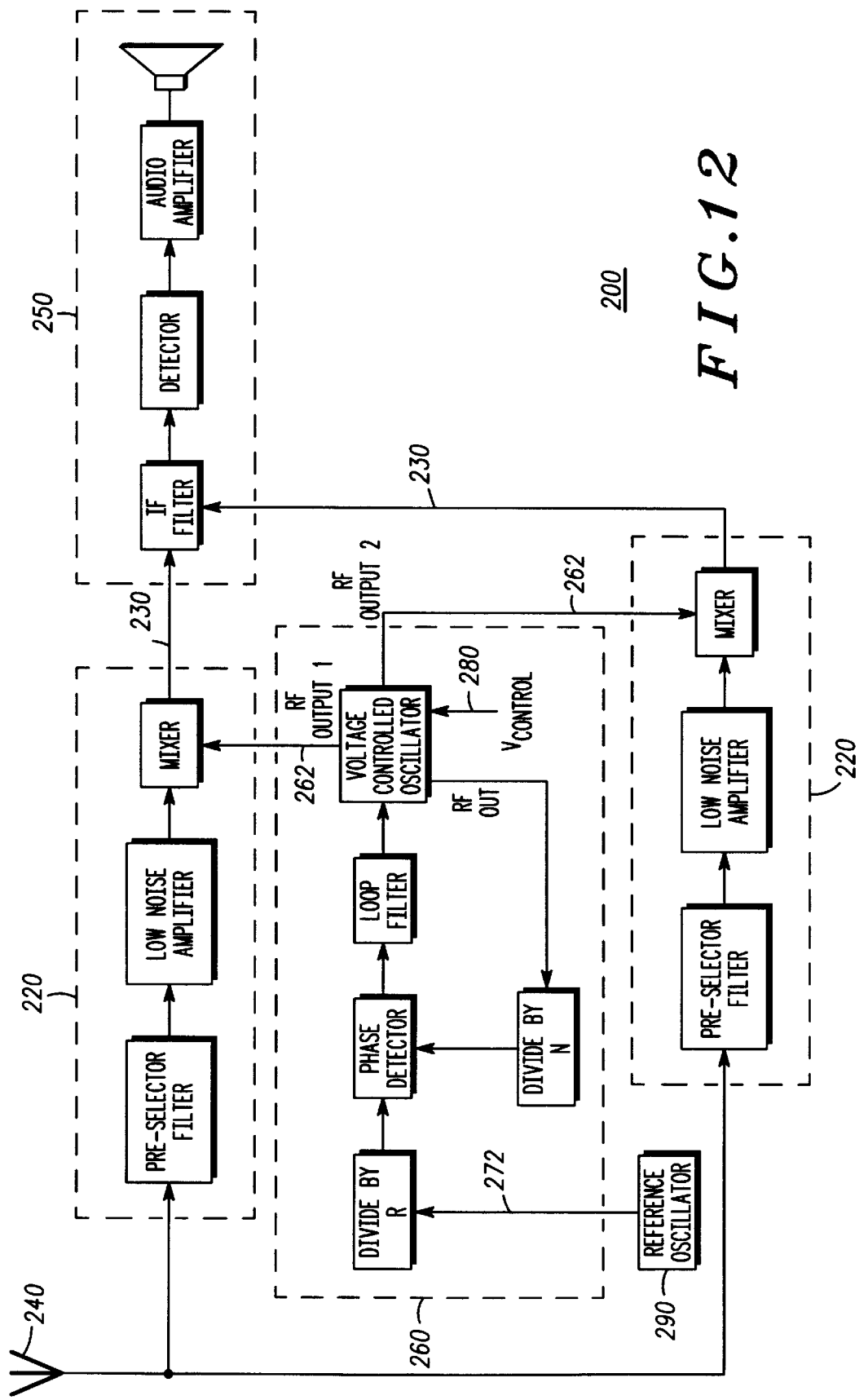
FIG. 12 is a block diagram of a radio communication device incorporating a dual output, dual frequency voltage controlled oscillator, in accordance with the present invention.

FIG. 12 shows a second preferred embodiment of a radio receiver 200 of FIG. 10 utilizing the dual output with feedback, dual band voltage controlled oscillators of FIGS. 2–6, 8 and 9. The radio receiver 200 includes an antenna 240 coupled to a receiver 220 which provides an output 230 to associated radio circuitry 250, a reference oscillator 290 coupled to a dual band frequency synthesizer 260 controlled by a band change signal 280 and incorporating the VCO of the present invention and feeding a local oscillator signal 262 to the receiver 220.

The radio receiver 220 includes two pre-selector filters each of which selectively passes a different desired frequency band; 800 MHz and 1.9 GHz, for example. Each tracking pre-selector filter feeds a filtered signal to an associated low noise RF amplifier tuned for the particular filter signal. The amplifier provides an amplified signal of the desired frequency to an associated mixer. The frequency synthesizer 260 provides one of the desired frequency band signals to its corresponding mixer. The frequency band signal provided is responsive to a band change signal 280. For example, when $V_{control}$ is held low, a local oscillator signal 262 within a 1.9 GHz band is produced and applied to the corresponding 1.9 GHz mixer for example, and when $V_{control}$ is held high, a local oscillator signal 262 within a 800 MHz band is produced and applied to the corresponding 800 MHz mixer for example. The mixer being supplied with the local oscillator signal 262 provides a mixed down IF output 230 to associated radio circuitry 250.

The associated radio circuitry 250 can contain an IF filter, detector, audio amplifier, and transducer, for example. The IF filter selects the correct IF output from the multiple frequency products produced by the mixers. The correct IF output is converted to an audio signal in the detector, which is subsequently amplified and transduced by a speaker into an audio signal, for example.

The frequency synthesizer 260 includes the VCO of the present invention which provides a separate feedback signal operable at both desired frequency bands to a phase detector via a first divider. A first or second local oscillator signal is applied to its corresponding mixer. The reference oscillator 290 provides a reference signal 272 to the phase detector via a second divider. The phase detector provides a correction signal to the VCO via a low pass loop filter, which removes high frequency artifacts. The correction signal is proportional to the phase difference between inputs to the phase detector which is known in the art as a phase locked loop. The present invention advantageously provides dual band outputs, which reduces interference between the different frequency bands.

EXAMPLE

Referring to in FIG. 1, a dual band voltage controlled oscillator was constructed using the following capacitive and inductive elements, in accordance with a preferred embodiment of the present invention:
R1=2 kohm R2=3 kohm
R3=1 kohm R4=4 kohm
R5=50 ohm R6=100 hm
C1=5 pf C2=2 pf
C3=6.8 pf C4=3.6 pf
C5=1 pf
CR1=6 pf CR2=3 pf
LR1=shorted stub stripline designed to provide 800 MHz output, or equivalent to about 6.6 nHy.
LR2=shorted stub stripline designed to provide 1.9 GHz output, or equivalent to about 2.3 nHy.

For this configuration $V_{control}$ was switched between ground (low) and $V_{supply}$ (high). When $V_{control}$ was held low, a frequency signal of about 1.9 GHz was obtained from RF out 36. When $V_{control}$ was held high, a frequency signal of about 800 MHz was obtained from RF out 36.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multi-frequency oscillator, comprising:
at least a first and a second transistor with respective first and second bases, first and second collectors and first and second commonly DC coupled emitters;

the second base is biased at a predetermined bias voltage greater than a base-emitter junction voltage of the transistors;

when the first base is biased at a voltage greater than the predetermined bias voltage of the second base, the first transistor turns on which causes the first resonant circuit to operate at a first frequency and which drives the emitter of the second transistor such that a potential across the second base and emitter is less than the base-emitter junction voltage turning the second transistor and second resonant circuit off; and when the first base is biased at a voltage less than the base-emitter junction voltage of the transistors, the first transistor and first resonant circuit turn off, the second transistor being biased at the predetermined bias voltage turns on which causes the second resonant circuit to operate at a second frequency.

2. The multi-frequency oscillator of claim 1, wherein the transistor emitters are commonly AC coupled, and the first and second bases are AC coupled to the respective first and second resonant circuits.

3. The multi-frequency oscillator of claim 1, wherein the transistor emitters are commonly AC coupled, and the first and second collectors are AC and DC coupled to the respective first and second resonant circuits.

4. The multi-frequency oscillator of claim 1, wherein the first and second emitters are AC and DC coupled to the respective first and second resonant circuits.

5. The multi-frequency oscillator of claim 1, wherein the collectors of the transistors are commonly connected such that a single output is provided which is operable at one of the first and second frequencies.

6. The multi-frequency oscillator of claim 1, wherein the collector of each transistor provides an output signal at a frequency of the associated active resonant circuit when the resonant circuit is operating and no output signal from the resonant circuit when the associated resonant circuit is inactive.

7. The multi-frequency oscillator of claim 1, wherein a feedback reactance of an oscillator loop of each resonant circuit is shared.

8. The multi-frequency oscillator of claim 1, wherein each resonant circuit is coupled with a variable reactance element responsive to a tuning signal such that the tuning signal tunes the base circuit within a frequency band of operation, all of the variable reactance elements being controllable by one tuning signal.

9. The multi-frequency oscillator of claim 1, wherein the multi-frequency oscillator is a dual frequency band voltage controlled oscillator.

10. The multi-frequency oscillator of claim 1, wherein the second frequency is at least twenty percent higher than that of the first frequency.

11. The multi-frequency oscillator of claim 1, wherein each resonant circuit configuration is selected from one of the group of: a Colpitts design, a Clapp design, a Driscoll design, a Seiler design, a Butler design, a Pierce design, and a Hartley design.

12. A dual frequency band voltage controlled oscillator, comprising:
a first and a second transistor with respective first and second bases, first and second collectors and first and second commonly AC and DC coupled emitters;
the first and second bases are AC coupled to respective first and second resonant circuits, a feedback reactance is shared between an oscillator loop of each resonant circuit, the second base is biased at a predetermined bias voltage greater than a base-emitter junction voltage of the transistors;

when the first base is biased at a voltage greater than the predetermined bias voltage of the second base, the first transistor turns on which causes the first resonant circuit to operate at a first frequency band and which drives the emitter of the second transistor such that a potential across the second base and emitter is less than the base-emitter junction voltage turning the second transistor and second resonant circuit off; and when the first base is biased at a voltage less than the base-emitter junction voltage of the transistors, the first transistor and first resonant circuit turn off, the second transistor being biased at the predetermined bias voltage turns on which causes the second resonant circuit to operate at a second frequency band.

13. The dual frequency band voltage controlled oscillator of claim 12, wherein the collectors of the transistors are commonly AC and DC coupled such that a single RF output is provided which is operable at one of the first and second frequency bands.

14. The dual frequency band voltage controlled oscillator of claim 12, wherein the collector of each transistor provides an output signal within a frequency band of the associated active resonant circuit when the resonant circuit is operating and no output signal from the resonant circuit when the associated resonant circuit is inactive.

15. The dual frequency band voltage controlled oscillator of claim 12, wherein the transistor collectors are isolated from AC ground by a low impedance device selected from one of the group of an RF choke and a low impedance resistor.

16. The dual frequency band voltage controlled oscillator of claim 12, wherein each resonant circuit is coupled with a variable reactance element responsive to a tuning signal such that the tuning signal tunes the base circuit within each frequency band of operation, all of the variable reactance elements being controllable by one tuning signal.

17. The dual frequency band voltage controlled oscillator of claim 12, wherein the second frequency band is at least twenty percent higher than the frequency of the first frequency band.

18. A dual band radio communication device having a receiver and including a dual frequency band frequency synthesizer, comprising:

a locked loop circuit and detector chosen from the group consisting of a phase locked loop with a phase detector, a frequency locked loop with a frequency detector and a delay locked loop with a delay detector;

a reference oscillator providing a reference signal to a first input of the detector of the locked loop circuit, the detector providing a tuning signal for a voltage controlled oscillator; and a dual band voltage controlled oscillator, comprising:
  a first and a second transistor with respective first and second bases, the transistors having collectors and having commonly connected emitters;
  the first and second bases are coupled with respective first and second resonant circuits, the second base is biased at a predetermined bias voltage greater than a base-emitter junction voltage of the transistors;
  when the first base is biased at a voltage greater than the predetermined bias voltage of the second base, the first transistor turns on which causes the first resonant circuit to operate within a first frequency band and which drives the emitter of the second transistor such that a potential across the second base and emitter is less than the base-emitter junction voltage turning the second transistor and second resonant circuit off, a first frequency of the first resonant circuit is tunable within the first frequency band, responsive to the tuning signal of the detector, and is applied to a mixer and a second input of the detector; and
  when the first base is biased at a voltage less than the base-emitter junction voltage of the transistors, the first transistor and first resonant circuit turn off, the second transistor being biased at the predetermined bias voltage turns on which causes the second resonant circuit to operate at a second frequency within a second frequency band, the second frequency is responsive to the tuning signal of the detector and is applied to a mixer and a second input of the detector.

19. The dual band radio communication device of claim 18, wherein the loop circuit of the frequency synthesizer is a phase locked loop and the detector is a phase detector.

* * * * *